(12) United States Patent
Jin et al.

(10) Patent No.: US 8,664,044 B2
(45) Date of Patent: Mar. 4, 2014

(54) METHOD OF FABRICATING LAND GRID ARRAY SEMICONDUCTOR PACKAGE

(75) Inventors: Yonggang Jin, Singapore (SG); Romain Coffy, Saint Martin le Vinoux (FR); Jerome Teysseyre, Singapore (SG)

(73) Assignees: STMicroelectronics Pte Ltd., Singapore (SG); STMicroelectronics Grenoble 2 SAS, Grenoble cedex (FR)

( * ) Notice: Subject to any disclaimer, the term of this patent is extended or adjusted under 35 U.S.C. 154(b) by 226 days.

(21) Appl. No.: 13/287,816

(22) Filed: Nov. 2, 2011

(65) Prior Publication Data
US 2013/0105982 A1 May 2, 2013

(51) Int. Cl.
*H01L 21/00* (2006.01)
*H01L 23/12* (2006.01)

(52) U.S. Cl.
USPC ........... 438/110; 438/129; 438/622; 438/637; 257/700; 257/723; 257/E23.07; 29/829; 29/857; 29/874

(58) Field of Classification Search
None
See application file for complete search history.

(56) References Cited

U.S. PATENT DOCUMENTS 7,067,356 B2 * 6/2006 Towle et al. ................. 438/122

OTHER PUBLICATIONS

"Manufacturing with the Land Grid Array Package," Networking & Multimedia Group, Freescale Semiconductor, Inc., Austin, TX, 2005, Revised Dec. 2008, 16 pages.
Chua et al., "Method for Producing Vias in Fan-Out Wafers Using Dry Film and Conductive Paste, and a Corresponding Semiconductor Package," U.S. Appl. No. 12/977,697, filed Dec. 23, 2010, 34 pages.
Goh et al., "Filp-Chip Fan-Out Wafer Level Package for Package-On-package Applications, and Method of Manufacture," U.S. Appl. No. 12/651,365, filed Dec. 31, 2009, 20 pages.
Jin, "Manufacturing Fan-Out Wafer Level Packaging," U.S. Appl. No. 12/330,044, filed Dec. 8, 2008, 39 pages.
Luan et al., "Reliable Large Die Fan-Out Wafer Level Package and Method of Manufacture," U.S. Appl. No. 12/651,362, filed Dec. 31, 2009, 27 pages.

* cited by examiner

*Primary Examiner* — Alonzo Chambliss
(74) *Attorney, Agent, or Firm* — Seed IP Law Group PLLC (57) ABSTRACT

A fan-out wafer level package is provided with a semiconductor die embedded in a reconstituted wafer. A redistribution layer is positioned over the semiconductor die, and includes a land grid array on a face of the package. A copper heat spreader is formed in the redistribution layer over the die in a same layer as a plurality of electrical traces configured to couple circuit pads of the semiconductor die to respective contact lands of the land grid array. In operation, the heat spreader improves efficiency of heat transfer from the die to the circuit board.

13 Claims, 5 Drawing Sheets

METHOD OF FABRICATING LAND GRID ARRAY SEMICONDUCTOR PACKAGE

BACKGROUND

1. Technical Field

Embodiments of the disclosed invention are directed to a wafer level package for a semiconductor device, and in particular, to a land grid array package with improved thermal management.

2. Description of the Related Art

For manufacturers of semiconductor devices, there is a continuing pressure to increase the density and reduce the size of the devices, so that more devices can be made on a single wafer of semiconductor material, and so that products that incorporate the devices can be made more compact. One response to this pressure has been the development of chip scale and wafer level packaging. These are packages that have a footprint that is very close to the actual area of the semiconductor die. They are generally direct surface mountable, using, e.g., ball grid arrays (BGA) and flip chip configurations.

A land grid array (LGA) package is similar to a BGA package, in that contact pads are provided on the surface of the package at a pitch that is compatible with contacts of a particular circuit board design, but where the contacts on a BGA package are configured to receive solder balls, the contact pads of an LGA package are planar, configured to make full contact with the contacts on the circuit board. A very small volume of solder, relative to the volume of a solder ball of a comparable BGA, is used to couple each contact to the circuit board. Thus, an LGA package lies much closer to the circuit board than a BGA package.

Another development is the reconstituted wafer, in which a semiconductor wafer is separated into individual dice, which are spaced some greater distance apart than on the original wafer and embedded in a layer of molding compound to form the reconfigured wafer. A redistribution layer is formed over the dice to relocate contact points on the new wafer. One benefit is that this provides increased area for each die for "back end" processes, such as the formation of contacts at a scale or pitch that is compatible with circuit board limitations, without sacrificing valuable real estate on the original wafer. Such packages are typically referred to as fan-out wafer level packages (FWLP), because the contact positions of the original die are "fanned out" to a larger foot print.

BRIEF SUMMARY

According to an embodiment, a fan-out wafer level package is provided, including a semiconductor die embedded in a reconstituted wafer. A plurality of circuit pads positioned on a face of the die provide input/output connections to a device formed in the die. A redistribution layer is positioned over the semiconductor die, and includes a land grid array on a face of the package. The redistribution layer also includes a plurality of electrical traces arranged to place each of the circuit pads in electrical contact with a respective contact land of the land grid array. A heat spreader is positioned in a same layer of the redistribution layer as the plurality of electrical traces.

According to an embodiment, a manufacturing method is provided, in which the heat spreader is formed in the redistribution layer during the same process steps employed to form the plurality of electrical traces.

DETAILED DESCRIPTION

Figure 1A:
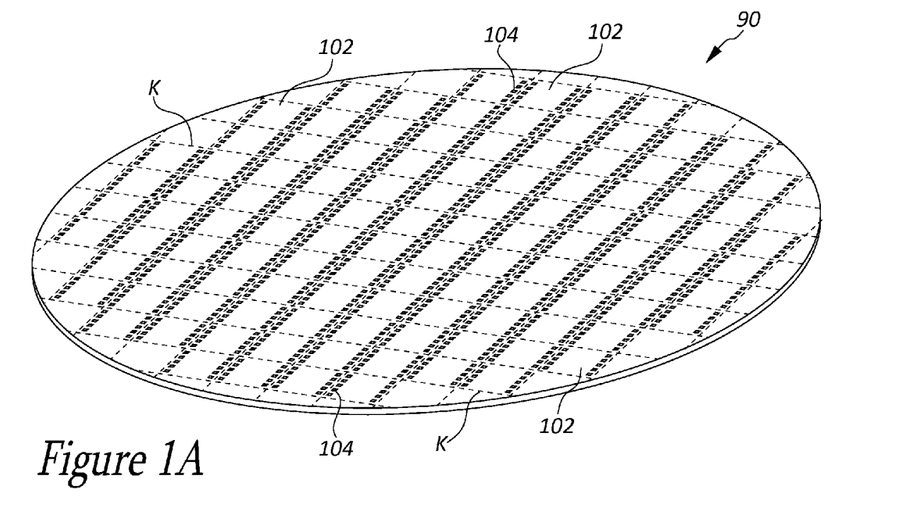
FIG. 1A is a perspective view of a semiconductor material wafer on which a number of individual semiconductor devices have been formed.

FIG. 1A is a perspective view of a semiconductor material wafer 90 on which a plurality of individual semiconductor are been formed. Dotted kerf lines K indicate the locations where the semiconductor wafer 90 will be sawn to separate the wafer into individual dice 102. Each die 102 includes one of the semiconductor devices and a plurality of circuit pads 104 positioned on a face of the die and providing input and output contacts for the device formed in the die prior to separation of the semiconductor material wafer 90 of FIG. 1A.

Figure 1B:
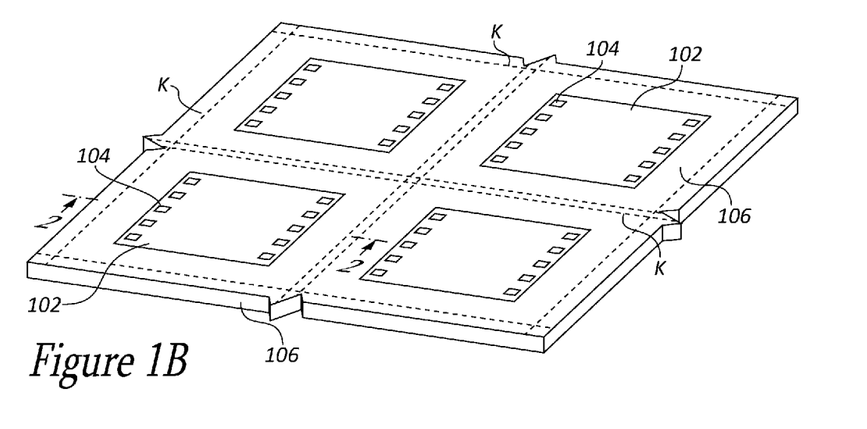
FIG. 1B is a perspective view of a portion of a reconstituted wafer at an early stage of manufacture of a plurality of semiconductor packages, each incorporating one of the semiconductor devices of the wafer of FIG. 1A, according to an embodiment.
Figure 2:
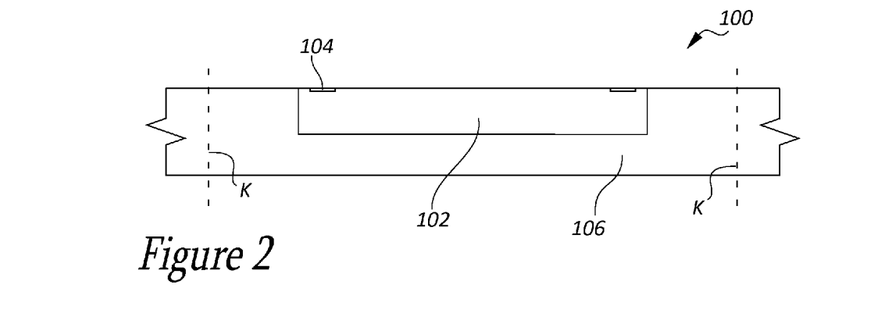
FIGS. 2-4 are diagrammatical side views of a smaller portion of the wafer of FIG. 1B, showing respective stages of manufacture of a single one of the plurality of semiconductor packages, as viewed along lines 2-2 of FIG. 1B.
Figure 3:
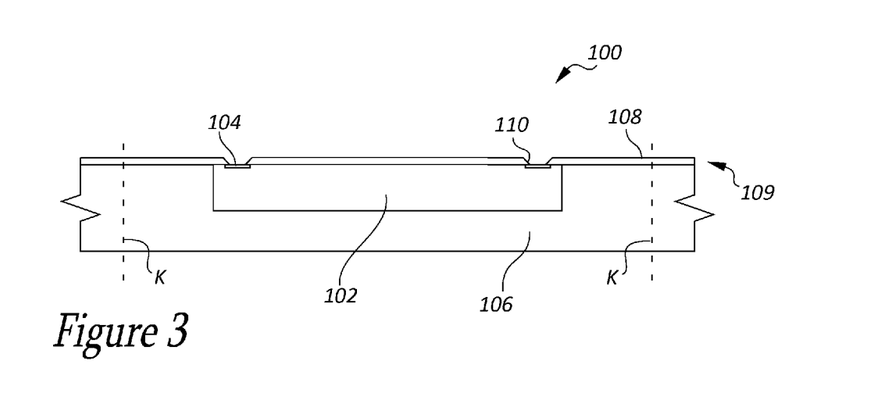
Figure 4:
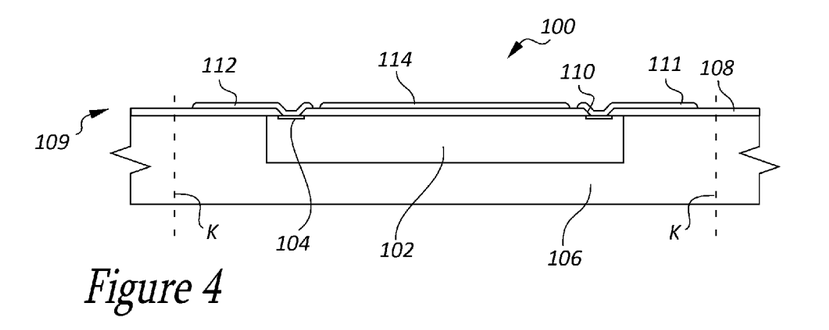

FIG. 1B is a perspective view of a portion of a reconstituted wafer 106 at an early stage of manufacture of a plurality of semiconductor packages 100, according to an embodiment. FIGS. 2-4 are diagrammatical side views of a smaller portion of the reconstituted wafer 106 of FIG. 1B, showing respective stages of manufacture of a single semiconductor package 100, as viewed along lines 2-2 of FIG. 1B. Although hundreds of semiconductor packages can be manufactured on a single reconstituted wafer 106, for ease of illustration and comprehension, only one of the packages 100 is shown in detail in FIGS. 2-4, the other packages being substantially identical.

FIGS. 1B and 2 show the reconstituted wafer 106 at the same stage of the manufacturing process. Each package 100 includes a semiconductor die 102 embedded in a molding compound layer that constitutes the primary structural element of the reconstituted wafer 106. Dotted kerf lines K indicate the location where the wafer 106 will be sawn to singulate the wafer into individual packages.

FIG. 3 shows a first dielectric layer 108 positioned on a face of the reconstituted wafer 106 as part of a fan-out redistribution layer 109. The dielectric layer 108 is patterned to define an opening 110 over each of the contact pads 104.

As shown in FIG. 4, a conductive layer 111, preferably of copper, is then deposited and patterned to define a plurality of electrical traces 112 and a heat spreader 114. Each of the plurality of electrical traces 112 is in electrical contact, at a first end, with a respective one of the circuit pads 104 of the die 102, via an opening 110 in the dielectric layer 108. The heat spreader 114 is deposited directly over the die 102, extends over a majority of the surface area of the die, and is electrically isolated from the circuit pads 104 of the die. According to another embodiment, the heat spreader 114 is coupled to a circuit ground.

Figure 5:
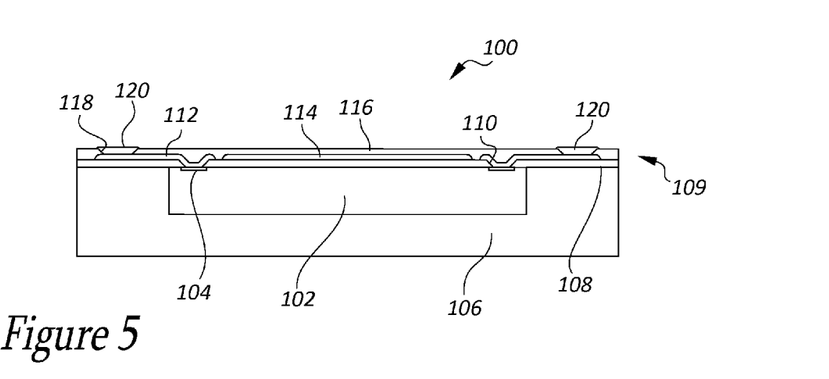
FIG. 5 is a diagrammatical side view of the finished package of the embodiment of FIGS. 1A-4, as viewed from the same lines 2-2 of FIG. 1B.

As shown in FIG. 4, the heat spreader 114 overlays a majority portion of a major face of the die 102. According to an embodiment, the layer 114 overlays about 70% of the die, as shown in FIGS. 4 and 5. A heat spreader that overlays over 50% of the die area is considered to cover a major portion of the die as that term is used herein, whereas a heat spreader that overlays over 80% of the die is considered to cover a substantial portion of the die, or to substantially cover the die as that term is used herein.

FIG. 5 shows a second dielectric layer 116, deposited over the conductive layer 111 and patterned to define openings 118 over each of the electrical traces 112. Contact lands 120 are then formed in the openings 118 of the second dielectric layer, in electrical contact with the respective electrical traces. Thus, each electrical trace 112 acts to electrically couple one of the contact pads 104 of the die 102 to a respective one of the contact lands 120. The lands 120 preferably include a layer of nickel covered with a thin layer of gold. The nickel fills the openings 118 and provides a hard substrate to support the gold layer, while the gold layer, which is extremely thin, prevents the formation of oxides that might otherwise interfere with a solder joint when the package 100 is mounted to a circuit board.

LGA packages provide a number of advantages over BGA packages. For example, an LGA package has a much lower stand-off height above a circuit board on which it is mounted than does a BGA package, which reduces the overall height of the mounted package. Additionally, the small volume of solder required for each joint reduces the amount of solder used, and, where the solder is lead-based, reduces the amount of lead introduced into the product stream. However, the thinner solder joints also make the package somewhat more susceptible to failure caused by thermal mismatch between the package and the circuit board. In the case of a BGA, the larger volume of solder is able to tolerate some degree of shear stress generated by different rates of thermal expansion between a semiconductor die and a circuit board. Because the solder joints of an LGA are much thinner, shear stresses are concentrated on the joint. Over repeated heating and cooling cycles, the solder joints can fatigue, and eventually fail.

The heat spreader 114 of the embodiment of FIG. 5 improves thermal conductivity of the package, and distributes heat more evenly, for improved thermal transfer to the circuit board. It should be noted that most materials used in forming the dielectric layers of redistribution layers have relatively low thermal conductivity characteristics. Even dielectrics that are specifically formulated to be thermally conductive typically have a thermal conductivity of less than about 3 k (k=watts of transmitted heat per meter-Kelvin). For comparison, aluminum has a thermal conductivity of about 240 k, and copper, about 400 k. Thus, by replacing some portion of the thickness of the redistribution layer with copper, the heat transfer characteristics can be significantly improved. Additionally, by forming the heat spreader 114 in the same process step as the electrical traces, the cost of manufacturing the package 100 is reduced, relative to packages in which a heat spreader is manufactured separately then coupled to the package.

Figure 6:
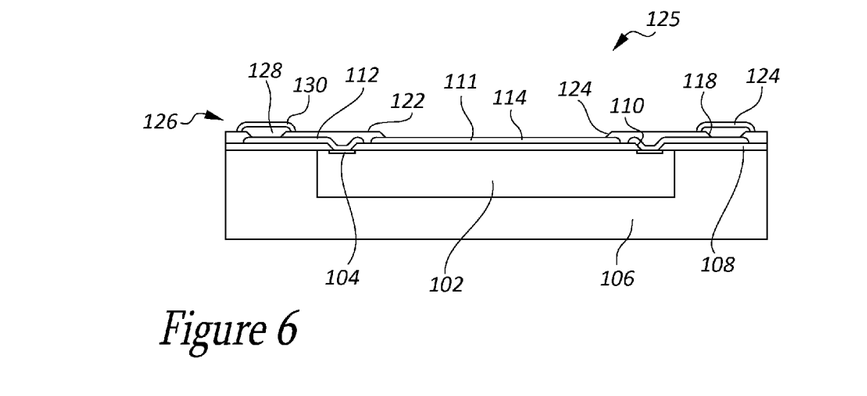
FIG. 6 is a diagrammatical side view of a finished semiconductor package according to another embodiment, as viewed from a position corresponding to the lines 2-2 of FIG. 1B.

FIG. 6 is a diagrammatical side view of a finished semiconductor package 125 according to another embodiment, as viewed from a position corresponding to the lines 2-2 of the embodiment of FIG. 1B. In many respects, the package 125 is substantially identical to the package 100 of FIG. 5, and the method of manufacture likewise includes elements that correspond to those previously described with reference to FIGS. 1B-4. Following deposition of the conductive layer 111, as described with reference to FIG. 4, a second dielectric layer 122 is deposited. In addition to the openings 118, a window 124 is defined in the second dielectric layer 122 over the heat spreader 114. Contact lands 126 are then formed, in which a layer of aluminum 128 is deposited in the openings 118, after which a layer of nickel and gold 130 is deposited over the aluminum layer.

In the embodiment of FIG. 6, use of the aluminum layer 128 of the contact lands 126 reduces the amount of nickel used, which is more expensive. A nickel layer is still provided, albeit in a thinner deposit, to provide a hard substrate for the very thin gold layer. The window 124 exposes the heat spreader 114 for improved heat transfer to the circuit board. During mounting of the package 125 to a circuit board, a thermally conductive underfill or grease layer can be provided to more efficiently transfer heat away from the package. According to an alternate embodiment, a metallic heat sink, made, for example, from copper, is provided on the circuit board, positioned and configured to be soldered, or otherwise thermally coupled to the heat spreader 114, further improving the efficiency with which heat is transferred from the package 125. The base material of the heat spreader 114 can be exposed in the window 124 of the finished package, as shown in FIG. 5, or can have other metals deposited, at the same time the contact lands 126 are formed, to increase mass, improve solder wettability, reduce oxide formation, etc.

Figure 7:
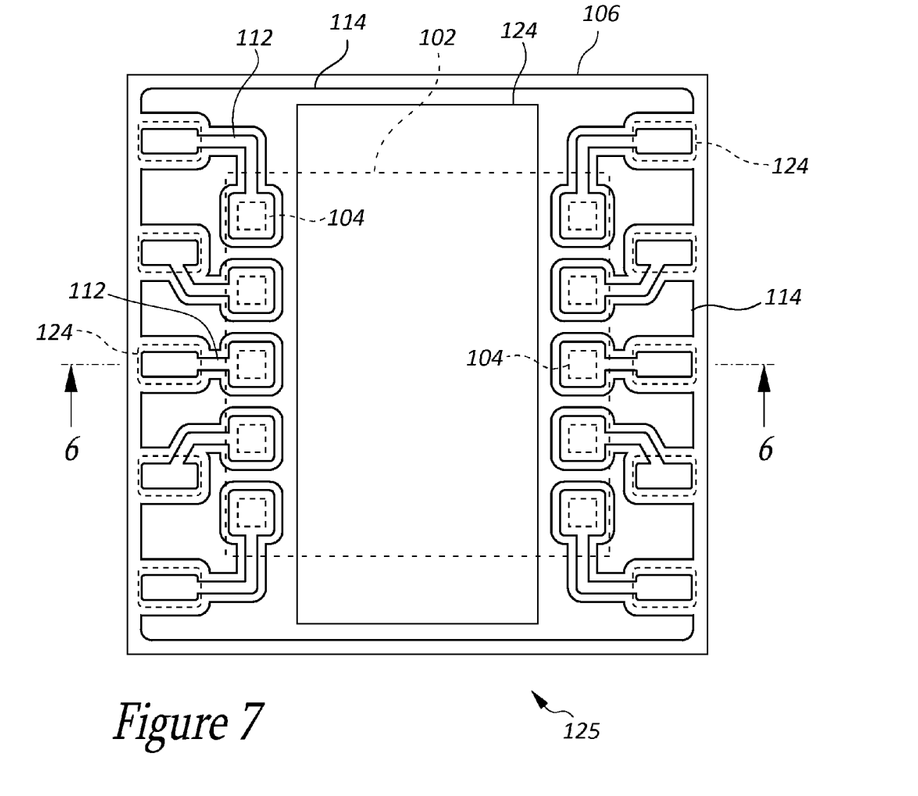
FIG. 7 is a diagrammatical plan view of the semiconductor package of FIG. 5, according to an alternate embodiment.

According to some embodiments, the heat sink 114 is substantially rectangular, and sized to fit over the die 102, having an area that is less than a surface area of the adjacent face of the die. According to an alternate embodiment, as shown in FIG. 7, the heat sink 114 extends beyond a region defined by the die 102, which provides an increased mass for improved thermal transfer. FIG. 7 is a diagrammatical plan view of the semiconductor package of FIG. 5, according to one alternate embodiment. Lines 6-6 define the position from which the side view of FIG. 6 is shown, and are in positions that correspond to the positions of the lines 2-2 of FIG. 1B. The position of the die 102 is shown in dotted lines, as are the positions of the circuit pads 104 and the contact lands 126. FIG. 7 also shows the position of the window 124, according to an embodiment. It can be seen that portions of the heat sink 114 extend between the electrical traces 112 to near the edge of the package 125. Thus, heat generated by operation of the die 102 is carried to positions very close to the contact lands 126, where it can be transferred to the contact pads of the circuit board to which the contact lands are coupled.

Figure 8:
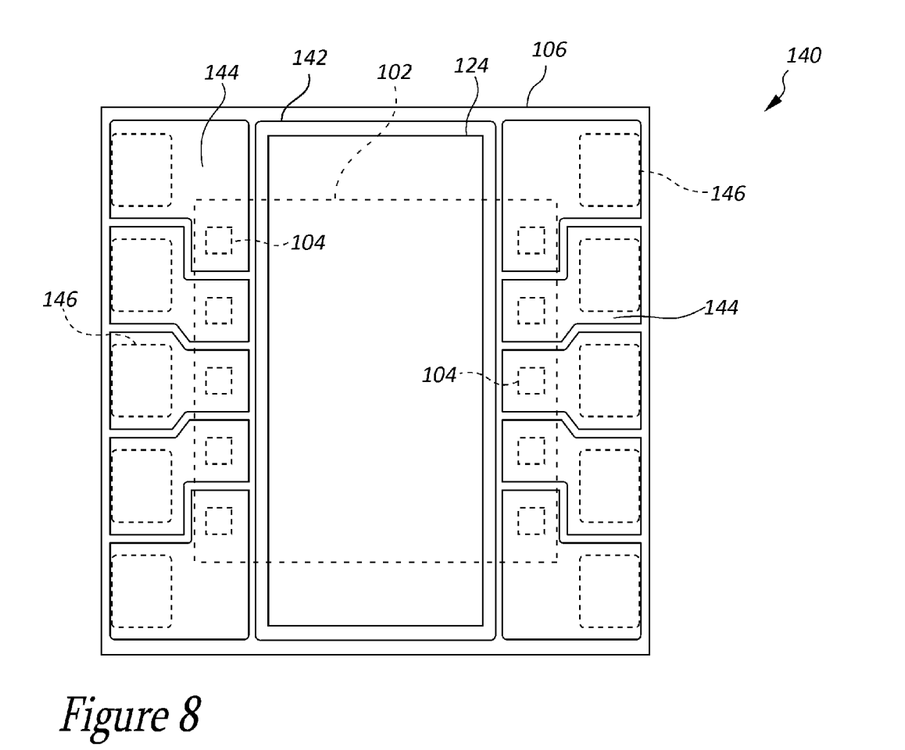
FIG. 8 is a diagrammatical plan view of a semiconductor package according to another embodiment.

According to another alternate embodiment, as shown in FIG. 8, electrical traces 144 are provided, which electrically couple the circuit pads 104 to respective contact lands 146. In comparison to the electrical traces 112 of FIG. 7, it can be seen that the electrical traces 144 of FIG. 8 are significantly larger. Additionally, the contact lands 146 are also larger than the lands 126 of FIG. 7. The dimensions of the electrical traces 144 are increased, relative to those of electrical traces 112, in order to increase their thermal transfer capacity. Likewise, the dimensions of the contact lands 146 are relatively larger, which, when the contact lands are coupled to similarly sized circuit board contact pads, increases the capacity of the package 140 to transfer heat to the circuit board.

Figure 9:
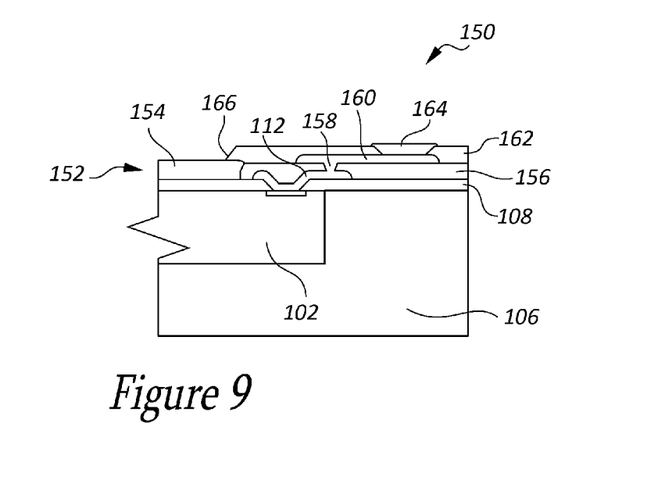
FIGS. 9 and 10 are diagrammatical side views of portions of semiconductor packages according to respective additional embodiments.

As is well known, many semiconductor packages employ redistribution layers that include a plurality of conductive layers in order to provide electrical traces on multiple layers. FIG. 9 is a detail of a package 150 according to an embodiment, that includes a redistribution layer 152. Following the formation of the first dielectric layer 108, as described with reference to FIG. 4, a first conductive layer is deposited and patterned to define the electrical traces 112 and a heat spreader 154. A second dielectric layer 156 is then deposited and patterned to define openings for vias 158 and to uncover the heat spreader 154. A second conductive layer is then deposited and patterned to form vias 158, define a second plurality of electrical traces 160, and to thicken the heat spreader 154. A third dielectric layer 162 is deposited, and patterned to define openings for contact lands 164 and a window 166 over the heat spreader 154. By defining an opening over the heat spreader 154 in each successive dielectric layer, the heat spreader can be made to have a thickness approximately equal to a sum of the thicknesses of all of the conductive layers formed in the RDL 152.

Figure 10:
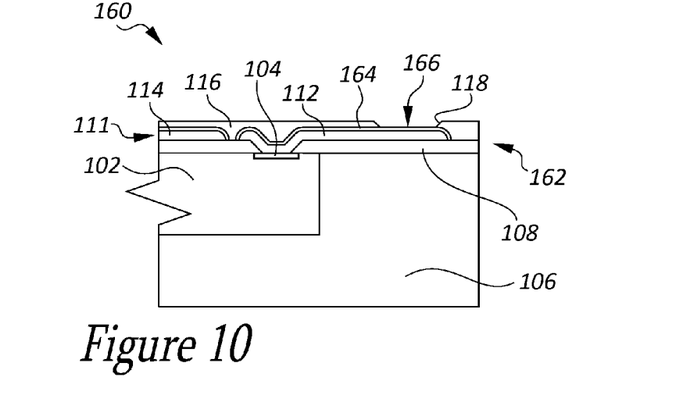

FIG. 10 is a detail of a package 160 according to another embodiment, that includes a redistribution layer 162. Following the deposition and patterning of the conductive layer 111, as described with reference to FIG. 4, a second conductive layer 164 is deposited over at least the electrical traces 112 of the conductive layer 111. The second dielectric layer 116 is then deposited and patterned, as described with reference to FIG. 5, to define the openings 118, which constitute the contact lands 166 of the package 160. The second conductive layer 164 provides a good bonding surface for a solder connection between the package 160 and the contact pads of a circuit board, and is preferably tin, but can be any of various conductive materials, including silver and gold.

The second conductive layer 164 can also be patterned to cover the heat sink 114, as shown in FIG. 10. This can be beneficial if the heat sink 114 is to be exposed, as described with reference to FIG. 6, or can be done as a matter of convenience, where, e.g., the time or expense of preventing deposition of the second conductive layer 164 on the heat sink exceeds the cost of the metal that would be saved.

The inventors have determined that under some circumstances, forming contact lands by depositing material in openings in a dielectric layer can produce a structure that might have a tendency to delaminate the material of the electrical trace from the underlying dielectric or passivation layer. The structure of FIG. 10 has not been found to be subject to the same tendency.

Formation of elements such as contact pads, contact lands, conductive traces, dielectric layers, UBM layers, etc., can be accomplished using many different processes that are very well known in the art. For example, according to one process, a thin metallic seed layer is deposited on a substrate, a positive-acting photosensitive plating resist layer is deposited over the seed layer, a photo mask is positioned over the resist layer, and the resist layer is exposed through the mask to a light source for a prescribed period, so that some portions of the resist layer are prevented from being exposed by the image of the mask. The resist layer is processed to remove the exposed portions of the layer, which in turn exposes the surface of the seed layer at those locations. The substrate is subjected to a plating process, during which a thick layer of metal is plated onto the seed layer in the locations where it is not covered by the resist layer. The resist layer is then removed leaving the plated metal layer in the form of the image. Finally, a brief chemical etch is performed to remove the portions of the seed layer that were previously protected by the resist layer during the plating process.

In another known process, a metal layer is deposited, and a resist layer is deposited over the metal layer, and patterned using, for example, the process described above, so that the portion of the metal layer that is to be retained is covered by the resist layer. An etch process is then performed to remove the exposed portion of the metal layer. Finally, the resist layer is removed, leaving the metal layer patterned as defined by the resist layer.

Either of the two processes described above can be used to form metallic elements. One is an additive process, while the other is a subtractive process. These processes are only two of many different known processes by which features or layers can be formed. In many cases, any of several known processes can be used to produce a particular feature or element. In other cases, selection of the process is influenced by factors such as, e.g., materials involved, cost, scale, etc. Because such processes are well known and understood, they will not be described in detail where the choice of process is not material to the disclosure. Where the specification or claims refer generically to depositing and patterning a layer of material to define one or more elements, this language is to be read broadly on any process for forming such elements in place. Where an element is described as being positioned on another element, this term is to be read, not only on elements formed in place, but also on elements that are made separately, and moved to a final position.

For the purposes of the present disclosure and claims, redistribution layer is a structure that includes one or more layers of dielectrics and conductors that are formed or deposited on an underlying substrate or layer to create and isolate redistributing signal paths of a semiconductor die. Processes for forming reconstituted wafers and redistribution layers are described in detail in a number of patents and patent applications, including application Ser. No. 12/330,044, filed Dec. 8, 2008; Ser. No. 12/651,365, filed Dec. 31, 2009; Ser. No. 12/651,362, filed Dec. 31, 2009; and Ser. No. 12/977,697, filed Dec. 23, 2010; each of which applications is incorporated herein by reference in its entirety.

Terms such as circuit pads, contact pads, contact lands, etc., are used substantially synonymously to refer to different structures that are functionally, and often structurally similar. Accordingly, where the claims use such terms, the different terms are for clarity, to identify one element from another; not because they necessarily have different structures. The corresponding elements of the claims are not limited by the terms as used in the description.

Ordinal numbers are used in the specification and claims to distinguish between elements so referenced. There is no necessary significance to the value of a number assigned to one element relative to other numbered elements. Furthermore, an ordinal number used to refer to an element in the claims does not necessarily correlate to a number used to refer to an element in the specification on which the claim reads. Nor does an ordinal number used to refer to a given element in one claim necessarily correlate with a number used to refer to a similar or corresponding element in an unrelated claim—obviously, where a claim refers to a numbered element of a claim from which it depends, the numbers will correspond.

The term couple, as used in the claims, includes within its scope indirect coupling, such as when two elements are coupled with one or more intervening elements, even where no intervening elements are recited.

Molding compounds are substances used to encapsulate semiconductor devices in many different packaging processes, are typically composite materials made from blends of ingredients such as, e.g., resins, hardeners, silicas, catalysts, pigments, and release agents, and are generally provided in a substantially liquid form of a selected viscosity so that they can be injected or poured. Molding compounds are available in a very wide range of formulations from different manufacturers and to meet many different criteria. Accordingly, the term molding compound is to be construed broadly to apply to all such compounds.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The various embodiments described above can be combined or omitted to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming a redistribution layer on a reconstituted wafer that includes a molding-compound layer and a semiconductor die embedded therein, the forming a redistribution layer including the steps of:
depositing a first conductive layer on the reconstituted wafer,
patterning the first conductive layer to define a plurality of electrical traces, each in electrical contact with a respective one of a plurality of circuit pads positioned on a face of the die, and to define a heat spreader that is electrically isolated from the die and from each of the electrical traces, the heat spreader being positioned over the die and sized to overlay a majority of a major face of the die, and
forming a plurality of contact lands, each in electrical contact with a respective one of the plurality of electrical traces.

2. The method of claim 1 wherein forming a redistribution layer comprises:
depositing a first dielectric layer on the reconstituted wafer;
patterning the first dielectric layer to define a plurality of openings, each over a respective one of the circuit contacts of the die, wherein the depositing a first conductive layer comprises depositing the first conductive layer on the first dielectric layer;
depositing a second dielectric layer over the first conductive layer; and
patterning the second dielectric layer to define a plurality of openings, each over a respective one of the plurality of electrical traces, wherein the forming a plurality of contact lands comprises positioning each of the plurality of contact lands at least partially in a respective one of the plurality of openings defined in the second dielectric layer.

3. The method of claim 2 wherein forming a redistribution layer further comprises patterning the second dielectric layer to define a window over the heat spreader.

4. The method of claim 1 wherein the forming a plurality of contact lands comprises depositing a layer of nickel in each of the plurality of openings defined in the second dielectric layer, and depositing a layer of gold over the layer of nickel.

5. The method of claim 1 wherein the forming a plurality of contact lands comprises depositing a layer of aluminum in each of the plurality of openings defined in the second dielectric layer, depositing a layer of nickel over the layer of aluminum, and depositing a layer of gold over the layer of nickel.

6. The method of claim 1 wherein the patterning the first conductive layer to define a heat spreader comprises defining the heat spreader to have a shape that is substantially rectangular in plan view, having dimensions that are smaller than dimensions of the face of the die.

7. The method of claim 1 wherein the patterning the first conductive layer to define a heat spreader comprises defining the heat spreader to include portions extending between respective pairs of the plurality of contact lands.

8. The method of claim 1, comprising, after forming the redistribution layer, cutting the reconstituted wafer into a plurality of packages, each of the packages including a semiconductor die embedded in a portion of the reconstituted wafer and a redistribution layer, including a plurality of electrical traces, a plurality of contact lands, and a heat spreader.

9. The method of claim 1 wherein forming a redistribution layer comprises:
depositing a first dielectric layer on the reconstituted wafer;
patterning the first dielectric layer to define a plurality of openings, each over a respective one of the circuit contacts of the die, wherein the depositing a first conductive layer comprises depositing the first conductive layer on the first dielectric layer;
depositing a second dielectric layer over the first conductive layer; and
patterning the second dielectric layer to define an opening over the heat spreader;
depositing an additional conductive layer over the second dielectric layer;
patterning the additional conductive layer to define an additional plurality of electrical traces;
patterning the additional conductive layer to define an additional thickness of the heat spreader.

10. A method, comprising:
forming a plurality of semiconductor devices on a semiconductor material wafer;
forming a plurality of circuit pads on a face of the semiconductor material wafer, each in electrical contact with one of the plurality of semiconductor devices;
separating the semiconductor devices from the semiconductor material wafer by cutting the semiconductor material wafer, each one of the plurality of semiconductor devices having a die;
forming a reconstituted wafer by embedding each of the plurality of dice into a layer of molding compound with each die positioned such that the face of the die is exposed and lies substantially coplanar with a face of the layer of molding compound;
forming a redistribution layer on the face of the reconstituted wafer, including the steps of:
depositing a first dielectric layer on the face of the reconstituted wafer;
patterning the dielectric layer to define openings over each of the circuit pads;

depositing a layer of conductive material over the dielectric layer;

patterning the layer of conductive material to define a plurality of electrical traces, each in electrical contact with a respective one of a plurality of circuit pads positioned on a face of the die, and to define a heat spreader that is electrically isolated from the die, the heat spreader being positioned over the die and sized to substantially cover a major face of the die, and forming a plurality of contact lands, each in electrical contact with a respective one of the plurality of electrical traces.

11. The method of claim 10 wherein the forming a plurality of contact lands comprises:

depositing a second dielectric layer over the first conductive layer;

patterning the second dielectric layer to define a plurality of openings over respective electrical traces of the first conductive layer; and depositing a second conductive layer in each of the plurality of openings defined in the second dielectric layer.

12. The method of claim 11 wherein the second conductive layer comprises a layer of nickel and a layer of gold.

13. The method of claim 10 wherein the forming a plurality of contact lands comprises:

depositing a second conductive layer over and substantially covering each of the plurality of electrical traces;

depositing a second dielectric layer over the second conductive layer;

patterning the second dielectric layer to define a plurality of openings over respective electrical traces.

* * * * *